(12) United States Patent
Doerr et al.

(10) Patent No.: US 6,327,401 B1
(45) Date of Patent: Dec. 4, 2001

(54) MULTIFREQUENCY LASER SYSTEM

(75) Inventors: Christopher Richard Doerr, Middletown; Charles H Joyner, Red Bank; Lothar Benedict Erhard Josef Moeller, Hazlet; Martin Zirngibl, Middletown, all of NJ (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/501,901

(22) Filed: Feb. 10, 2000

(51) Int. Cl.[7] ..................................................... G02B 6/28
(52) U.S. Cl. ............................................. 385/24; 359/127
(58) Field of Search ................................. 385/24, 31, 28; 359/115, 116, 124, 127, 128, 130

(56) References Cited

U.S. PATENT DOCUMENTS 5,488,500 * 1/1996 Glance ................................. 359/127
5,889,906 * 3/1999 Chen ...................................... 385/28

* cited by examiner

*Primary Examiner*—Akm E. Ullah (57) ABSTRACT

A multifrequency laser that uses a waveguide grating router as the filter for frequency control and encloses it within a structure that forms at each selected frequency two paths of slightly different lengths to create a DiDomenico-type of laser that uses a pair of coupled cavities for frequency control. In one embodiment two sets, each of N optical amplifications, are used to create two resonant paths at each frequency. In other embodiments, a portion of the output power is made to travel a second path to provide the second optical path.

16 Claims, 6 Drawing Sheets

FIG. 6

MULTIFREQUENCY LASER SYSTEM

FIELD OF THE INVENTION

This invention relates to multifrequency laser apparatus and, more particularly, to such apparatus that employs a novel resonant structure.

BACKGROUND OF THE INVENTION

The growing trend to optical wavelength division multiplexed (WDM) systems has created a need for laser apparatus that can be a source of a plurality of optical signals of well separated and stable frequencies. To this end, it is important that multilongitudinal mode operation at the chosen wavelength be suppressed. Additionally, it is important that a high bitrate modulation of the chosen wavelength be possible. It is also desirable that the laser apparatus be of small size, and preferably largely integrated on a single semiconductive chip.

Generally laser apparatus to be of small size involves the use of a semiconductive chip that is enclosed within an appropriate resonant structure. In one particular form, a waveguide grating router (WGR) is used to provide filter control of the operating wavelength. In such a structure it is desirable to have the filter bandwidth of the WGR as narrow as possible so that at most only a few longitudinal modes of the laser chip are lying in the WGR passband. Ordinarily a relatively large-sized WGR is needed for generating a narrow passband filter bandwidth.

However, the geometrical size of the laser cavity generally should be as small as possible because, to a first order approximation, the laser cavity length determines the maximum speed for data modulation in a long-cavity laser. Additionally the smaller the size of the laser chip, generally the smaller its cost because less semiconductive material is involved and more laser chips can be obtained from a wafer of a given size.

A resonant structure that has been developed for use in gas laser systems is the so-called DiDomenico laser resonator described in a paper in the *IEEE Journal of Quantun Electronics*, August 1966, pp. 331–322 entitled "Characteristics of a Single-Frequency Michelson-Type He-Ne Gas Laser." This structure is an open-ended resonator that provides longitudinal mode selection and amplitude stabilization in gas lasers.

It comprises a pair of coupled cavities, each enclosing an independently tunable amplifier whose outputs are combined. By choosing slightly different lengths for the two cavities, filter functions similar to those of a Fabry-Perot filter can be realized and the passband bandwidth of the resulting structure can be much narrower than that of either one of the two cavities. The conventional DiDomenico resonant structure includes a set of three mirrors and a beam splitter to form the pair of coupled cavities.

SUMMARY OF THE INVENTION

The present invention employs a modified form of DiDomenico resonant structure for the suppression of undesired multilongitudinal modes so that a plurality of well-separated stable laser wavelengths can be obtained from a structure of small size, advantageously largely integrated on a common substrate. To this end, the prior art MFL WGR-type lase is modified to provide two sets of resonant structures of different lengths at each frequency selected for operation.

In particular, in one embodiment of the invention, the multifrequency laser (MFL) comprises a WGR with an input coupling section and an output coupling section, each section of the free-space planar form, such as a star coupler, between which is connected a grating comprising planar waveguide arms of appropriate lengths. The ports of the coupling sections between which the waveguides are connected shall be described as the interior ports and the other ports of the coupling sections shall be described as the exterior ports. For a MFL to provide N separate laser outputs of different frequencies, in this embodiment there will be 2N semiconductive narrowband amplifiers forming two sets, each of N members, each tuned to a different one of the N output frequencies and one broadband semiconductive amplifier that will amplify the range of frequencies provided by the laser. Each of the 2N amplifiers has its output supplied to a different one of 2N exterior ports of the input coupling section of a WGR. Each of the interior ports of the input coupling section is connected to a separate interior port of the output coupling section. A single exterior port of the output coupling section of the WGR is connected, preferably by way of a broadband optical amplifier, to an optical fiber by which the desired optical beam is supplied to utilizing apparatus, such as a wavelength division multiplexing (WDM) transmission system. Reflecting surfaces are provided at opposite ends of the structure to enclose the amplifiers and the WGR.

In an alternative embodiment that employs only N narrowband optical amplifiers as the basic signal sources but a pair of broadband optical amplifiers, a portion of the output light that becomes available at a port in the output coupling section of the WGR is fed back into a second exterior port of the output coupling section of the WGR and is used as the second laser signal in a DiDomenico type laser. In another embodiment, the output from a single exterior port of the output coupling section of the WGR is passed through a suitable power divider, such as a beam splitter, and the two portions are supplied to separate amplifiers. One amplified portion is reflected back through the power divider back into the exterior port of the output coupling section of the WGR and the other amplified portion is partially transmitted via an optical fiber for utilization and the remainder reflected back into the exterior port of the output coupling section.

The invention will be better understood from the following more detailed description taken in conjunction with the accompanying drawing.

DETAILED DESCRIPTION

Figure 1:
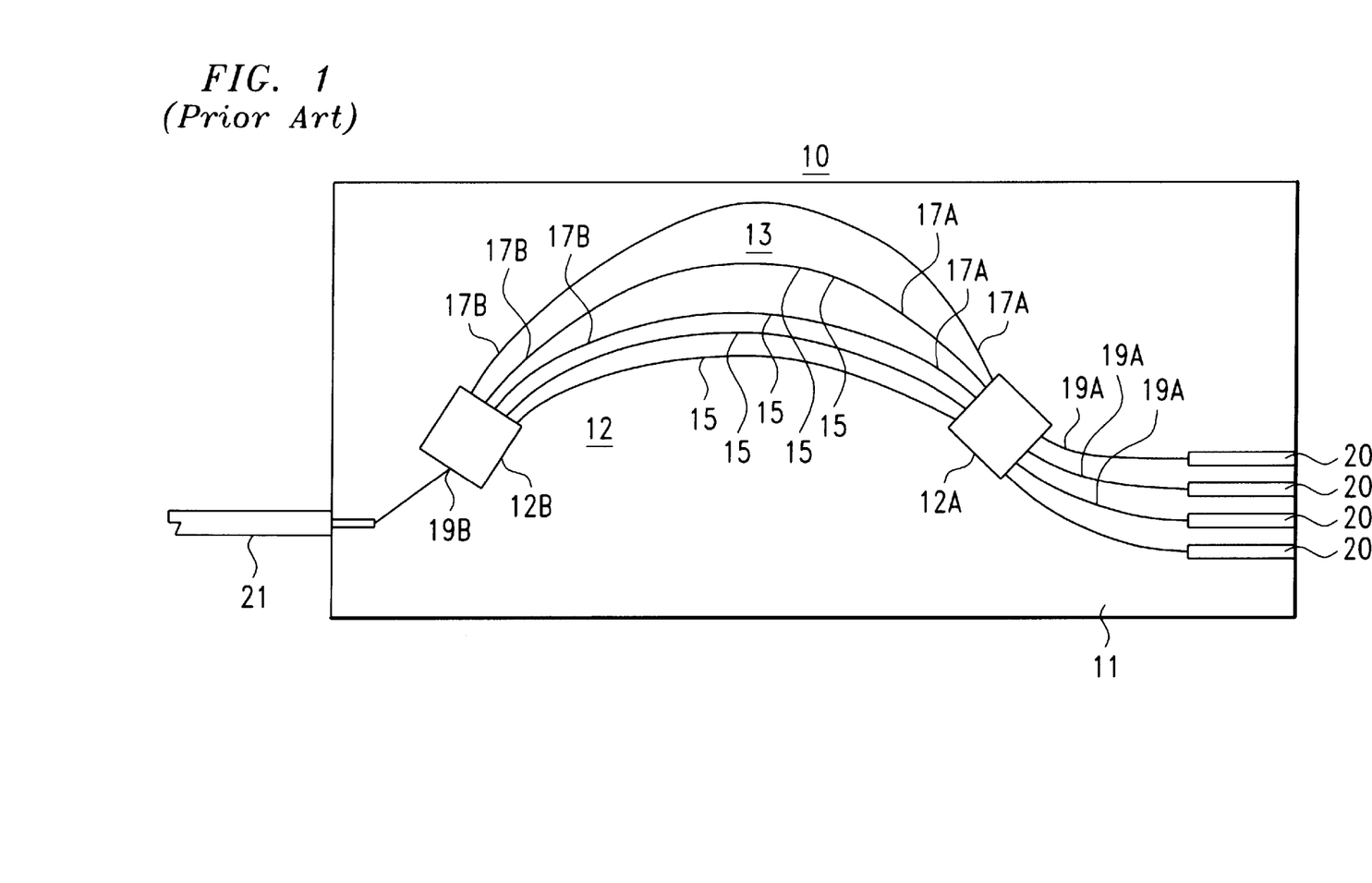
FIG. 1 shows schematically a conventional multifrequency laser (MFL) of the prior art form.

The prior art MFL 10 shown in FIG. 1 comprises a planar waveguide substrate 11, typically monocrystalline, on which have been formed a plurality of stripe optical amplifiers 20 and a conventional WGR 12 that comprises free-space input and output coupling sections 12A and 12B that are interconnected by a conventional WGR 13 consisting of a plurality of arms 15 of prescribed varying lengths for coupling together the interior ports 17A, 17B of coupling sections 12A and 12B, as in a conventional WGR.

Each exterior port 19A of coupling section 12A is connected by an optical waveguide path to a different one of optical amplifiers 20. Each optical amplifier 20 is advantageously of the semiconductive diode form, formed by a separate stripe. Each stripe advantageously includes a plurality of epitaxial layers, typically largely of lnGaAsP, and adapted to lase at a frequency primarily defined by the resonant frequency of the resonant structure in which the stripe amplifier is enclosed, as is known in the art. Each semiconductive stripe is provided with a connection, not shown, that provides a d-c current to the amplifier. This d-c current is of a level insufficient alone to have the amplifier lase. However, to the amplifier selected for lasing, there is provided additional current under control of the information being transmitted so that for the selected amplifier the current supplied is sufficient for lasing. The output coupling section 12B is provided with a single exterior port 19B, typically supplying an optical fiber 21 by means of which the modulated laser light is transmitted for utilization. Reflecting surfaces are provided at the two ends of the light paths in the substrate to provide a resonant structure.

The design of a MFL of the kind shown in FIG. 1 requires several trade-offs. First, one would like to have the filter bandwidth of the WGR as narrow as possible so that only a few longitudinal laser modes are lying in the WGR passband. Although nonlinear effects inside the laser cavities can be made to support single mode operation, a large-size WGR is usually required for generating a narrow passband filter band-width On the other hand, the geometrical size of the laser should be as small as feasible because, to a first order approximation, the laser cavity length determines the maximum speed for data modulation. There are various techniques known in the art for stabilizing operation of a WGR against unwanted grating orders by adjusting appropriately the length of the waveguide arms that form the grating of the WGR of which one such technique is known as chirping. As a result, a WGR can be used effectively as a narrow band filter for controlling the resonant frequency of a path between two reflecting surfaces that include the WGR. Additionally, as mentioned earlier, small-sized substrate chips are more attractive because of the economic aspects of chip fabrication.

With the addition of an additional optical filter by adding a resonant structure on the substrate chip to simulate a DiDomenico-type resonant structure, single-mode operation within the wider bandwidth passbands of a smaller sized WGR is possible on a relatively small substrate chip. This is the basic principle involved in an MFL in accordance with the invention.

Figure 2:
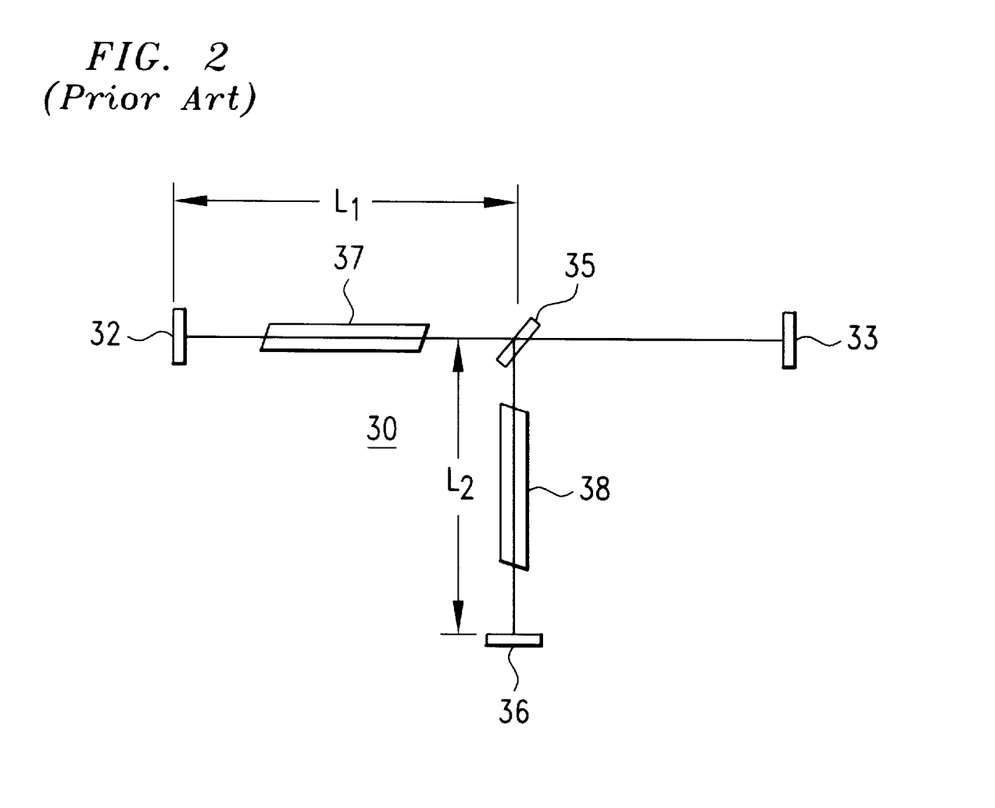
FIG. 2 schematically a prior art DiDomenico-type laser.

FIG. 2 shows schematically the basic elements of the standard DiDomenico-type laser 30 suitable for MFL implementation. It comprises mirrors 32 and 33 spaced part longitudinally. Inserted along the longitude between mirrors 32, 33 is the beam splitter 35 that diverts part of the light incident thereon in a transverse direction for incidence on mirror 36. Inserted along the path $L_1$ between mirror 32 and the beam splitter 35 is laser amplifier 37. Inserted along the path $L_2$, between beam splitter 35 and mirror 36 is the laser amplifier 38. Amplifiers 37 and 38, which in the original DiDomenico design were of the gas type, are each designed by control of the filter passband for amplification at the desired output frequency. In this coupled cavity resonator, the filter passband is determined primarily by the difference in lengths of paths $L_1$ and $L_2$.

Figure 3:
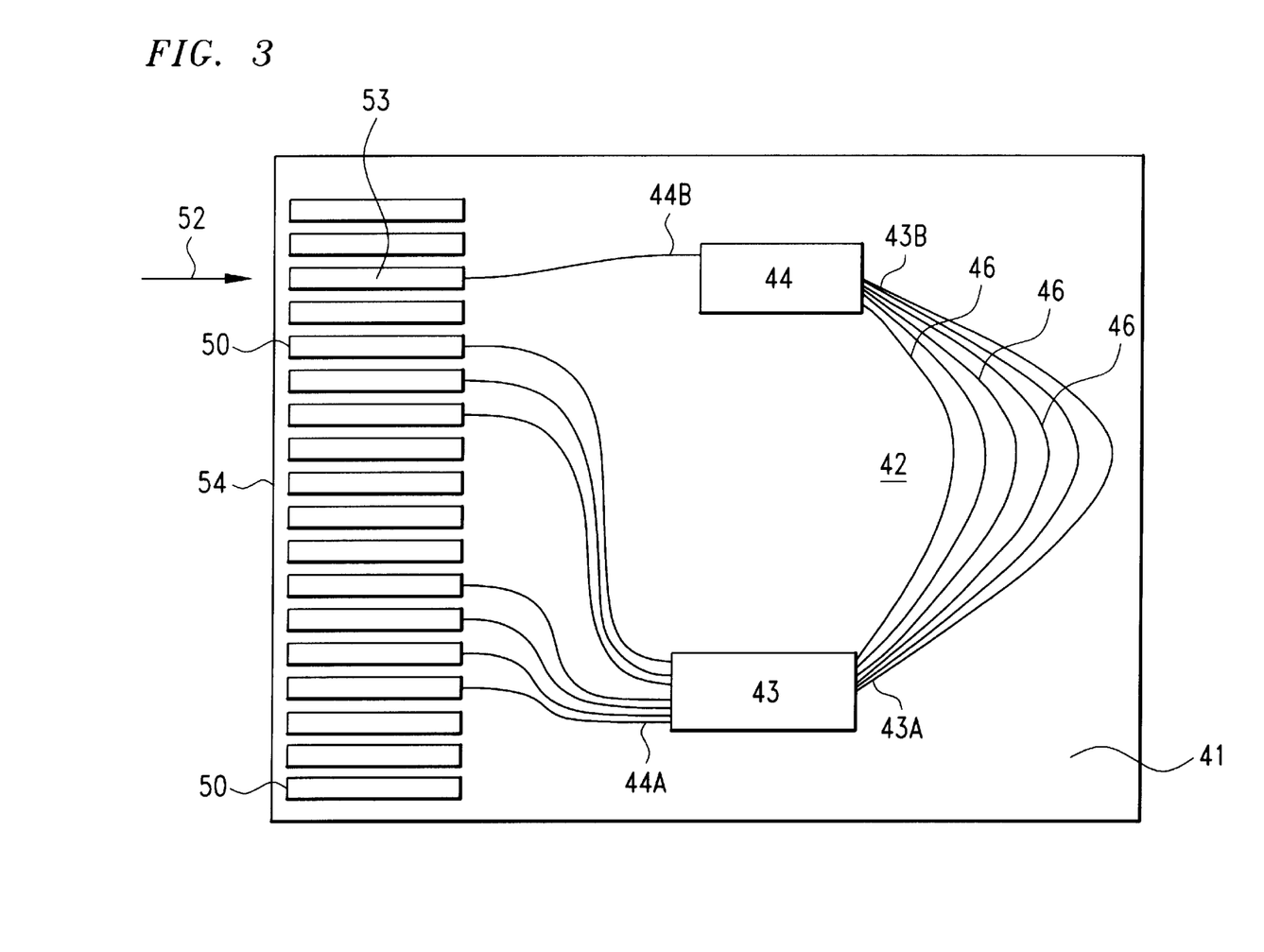
FIGS. 3, 4, 5 and 6 show schematically different embodiments of a multifrequency laser in accordance with the invention.

FIG. 3 shows a MFL apparatus 40 in accordance with the invention that uses a modified form of a coupled resonant structure arrangement that is used in the invention in place of the kind shown in FIG. 2. In particular, the coupled pair of cavities is simulated by a pair of reflective surfaces between which is enclosed a single WGR adapted to provide in the output coupling section two light spots, for each of the different frequencies that are combined as single spots at the output exterior port. This involves use of the WGR to establish two overlapping resonant structures of slightly different optical lengths.

Laser apparatus 40 comprises a suitable substrate 41, advantageously a semiconductive chip on which advantageously are supported all the basic elements so as to form an essentially monolithic structure. The apparatus includes a WGR 42 having free space planar input and output coupling sections 43 and 44 whose interior ports 43A, 44A are coupled together by optical waveguide arms 46 of different lengths in the usual manner of a WGR.

The input coupling section 43 has its 2N interior ports 43A connected separately to the 2N optical amplifiers 50 that form two sets, each set including a separate amplifier for each of the N desired frequencies connected by a separate path of different lengths to its exterior port. The two amplifiers of each set are included in resonant structures of slightly different lengths to simulate DiDomenico-type operation. Each amplifier is advantageously of the semiconductive diode type, described previously as known in the art, typically comprising layers of compound semiconductors. Each set is connected to the input coupling section 43 by way of its exterior ports 43B to form a set of light spots of different frequencies at the N interior ports of the output coupling sections. These light spots combine to form a single spot of light at the single exterior port 44B of the output coupling section 44. The single exterior port 44B is coupled to the output optical fiber 52. A broadband stripe-type semiconductive amplifier 53 is included, advantageously also supported on substrate 41, between the port 44B and the optical fiber 52, as shown. Each semiconductive amplifier 50 is adapted to be activated when desired to a negative temperature state (the state at which it amplifies) by an electric current provided by a suitable electrode connection (not shown to simplify the drawing) in known fashion, as described previously. Typically only one pair of amplifiers, one from each set, corresponding to the same frequency is activated at a given time to provide an information-modulated signal, although it should be feasible by appropriate design to operate simultaneously at more than one wavelength to be available either at a common output fiber or at different output fibers connected to different ports of the output coupling section 44.

To form the necessary resonant structures for each laser, reflecting surfaces are provided advantageously at the outside end of each semiconductive amplifier 50 by enclosing a reflective surface there, such as by a mirror surface. Alternatively if, as is preferred, the semiconductive amplifiers are provided as separate semiconductive stripes extending essentially to the edge of substrate 41, as shown in FIG. 3, the change in index of refraction at the edge 54 of the semiconductive substrate 41 and free space can be used to provide the desired reflection. Because of the different length of the wavepaths between the optical amplifier and the interior port of the input coupling section experienced by the two signals of the same frequency, there is achieved the desired DiDomenico-type operation.

The other reflecting surface of each resonant structure can be provided either as a partially reflecting surface on the outside end of amplifier 53, or by the change in index of refraction by locating the amplifier at the edge 54 of the substrate, as previously described. The amplifier 53 is advantageously kept continuously in a broadband amplifying state below the threshold and can be of the same stripe form of narrow band amplifiers 50.

Figure 6:
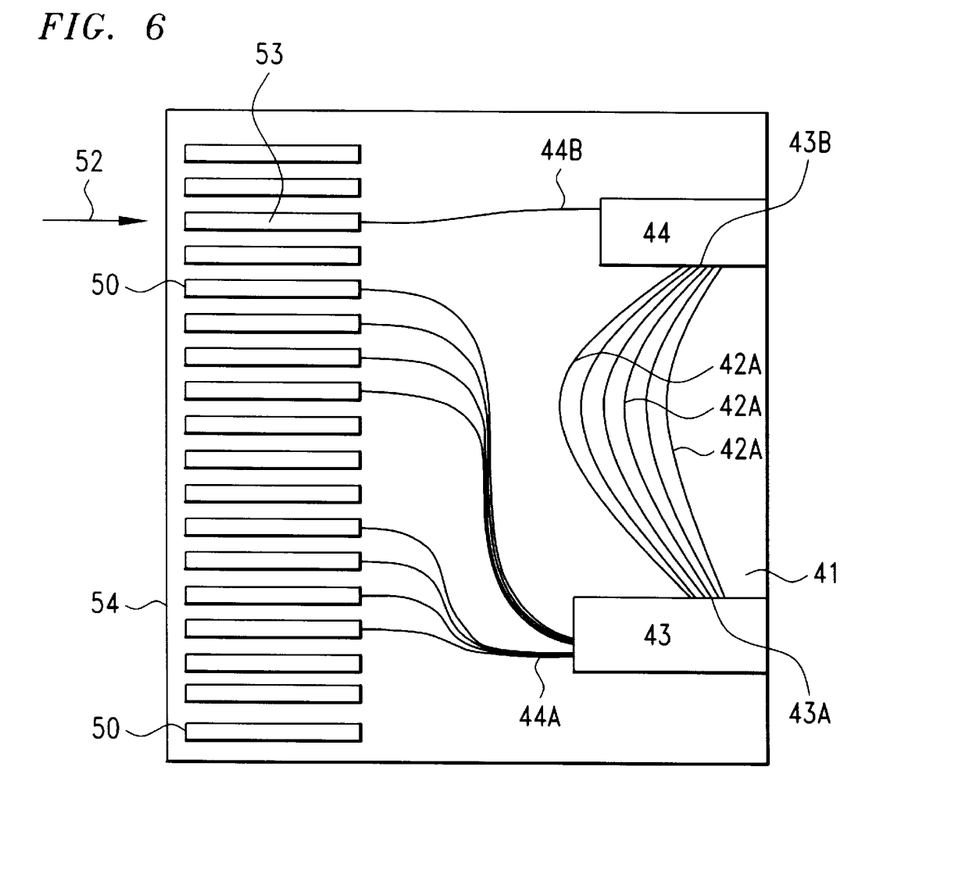

Generally, it is advantageous also to form the WGR by suitable epitaxial layers on the semiconductive substrate 41 in known fashion to form an essentially monolithic structure for the basic elements of the laser apparatus. In such a monolithic design, there is made available a very compact structure in which the dimensions involved are advantageously very small permitting a very high modulation rate of input information typically by appropriate modulation of the input d-c current to the semiconductive amplifiers. Additionally when the WGR is small, it becomes feasible to flip over to rotate the grating by 180° to position it in the space roughly defined by the two coupling sections close to the optical amplifiers, as shown in FIG. 6 where the WGR 42 is shown so located. The remaining numerals are unchanged.

The MFL shown in FIG. 3 can be modulated in several ways. A possible mode, similar to that described for the MFL of FIG. 1 is to supply a constant dcurrent to each of the narrow band stripes 50 of a level insufficient to cause lasing and to impress on the pair of stripes selected a modulation voltage of an amplitude on the pair of stripes selected to provide lasing. Alternatively, each pair of stripes 50 associated with the frequency selected for lasing can temporarily be supplied with a d-c current adequate for lasing and the current supplied to the broadband amplifier 53 is modulated appropriately off and on during such lasing in accordance with signal information to provide the desired modulated light in the output fiber.

Figure 4:
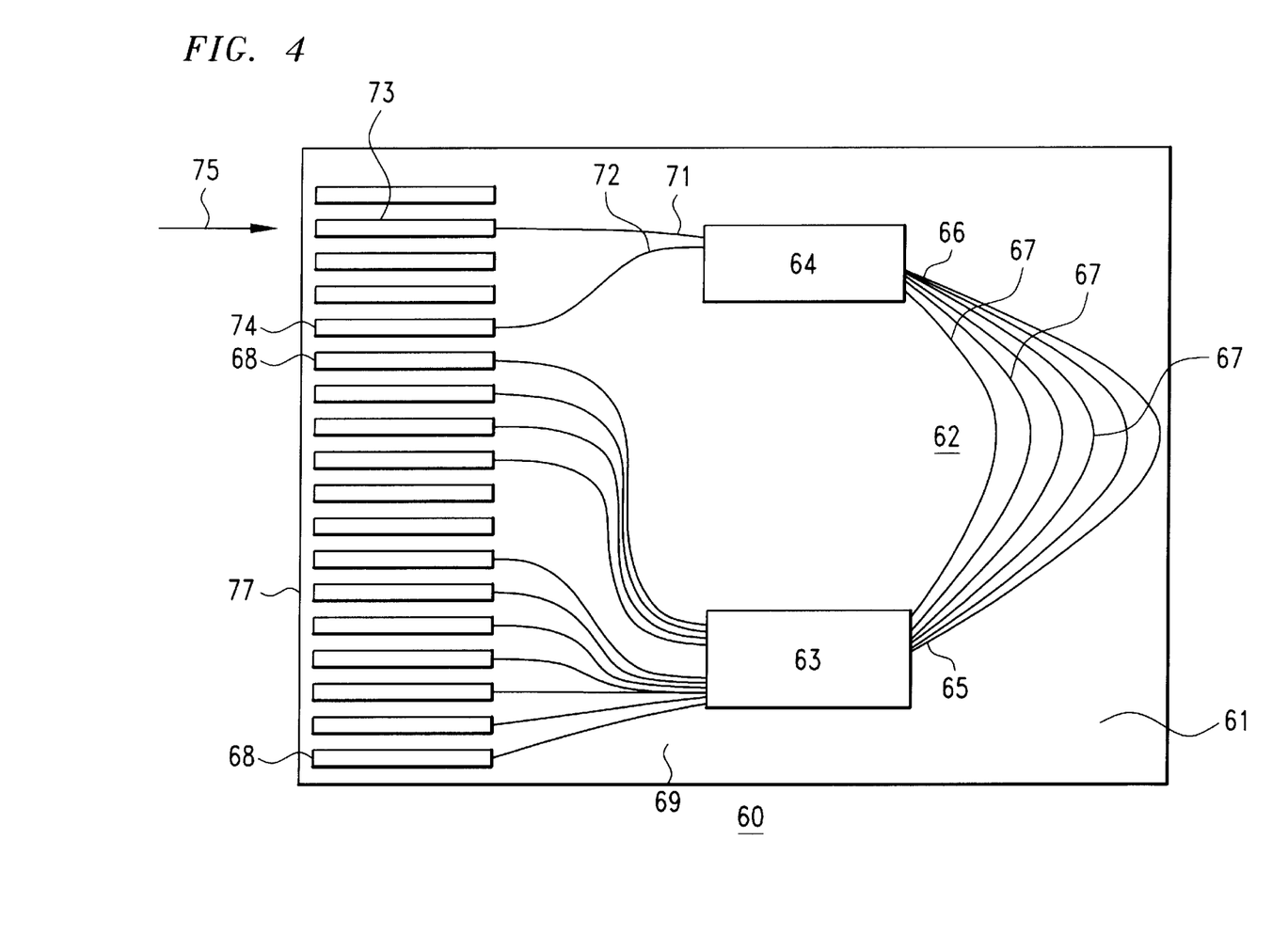

FIG. 4 shows an alternative embodiment 60 that uses fewer optical amplifiers and derives the second component of the desired frequency from a different resonant structure, as characteristic of a DiDomenico-type laser, by feedback of a portion of the output of the desired frequency that becomes available as the output at an exterior port of the output coupling section of its WGR.

In particular, the N frequencies laser apparatus 60 advantageously includes, as did the embodiment of FIG. 3, a semiconductive substrate 61 on which the main components are formed. These include the WGR 62 that comprises input and output coupling sections 63, 64 respectively, whose N interior ports 65, 66, respectively, are interconnected by the grating formed by N waveguides arms 67. The N exterior ports of the input coupling section 63 of the WGR are supplied by N optical amplifiers advantageously formed by semiconductive stripes 68 of appropriate materials with each designed to lase at a different one of the N desired output frequencies, as previously described for the narrowband optical amplifiers described in the embodiment of FIG. 3. The outputs of these amplifiers are supplied to separate ones of the exterior ports 69 of coupling section 63 in the usual fashion.

In this embodiment two exterior ports 71, 72 are provided in the output coupling section 64 each of which provides light of the same reflected frequency. Each of these ports supplies a separate broadband optical amplifier 73, 74. Amplifier 73 is terminated in a surface that is only partially reflective and the transmitted light is supplied to an optical fiber 75 for utilization, while the reflected portion is returned to the exterior port 71 of the output coupling section 64 of the WGR. Amplifier 74 is terminated to be essentially only reflective and the reflected light is similarly returned to the exterior port 72 of the output coupling section 64 of the WGR. The desired reflections can be provided either by a suitable coating or by a change in refractive index at edge 77, as previously described. The outside ends of the stripes 68 forming the narrowband amplifiers are highly reflective as previously described.

Figure 5:
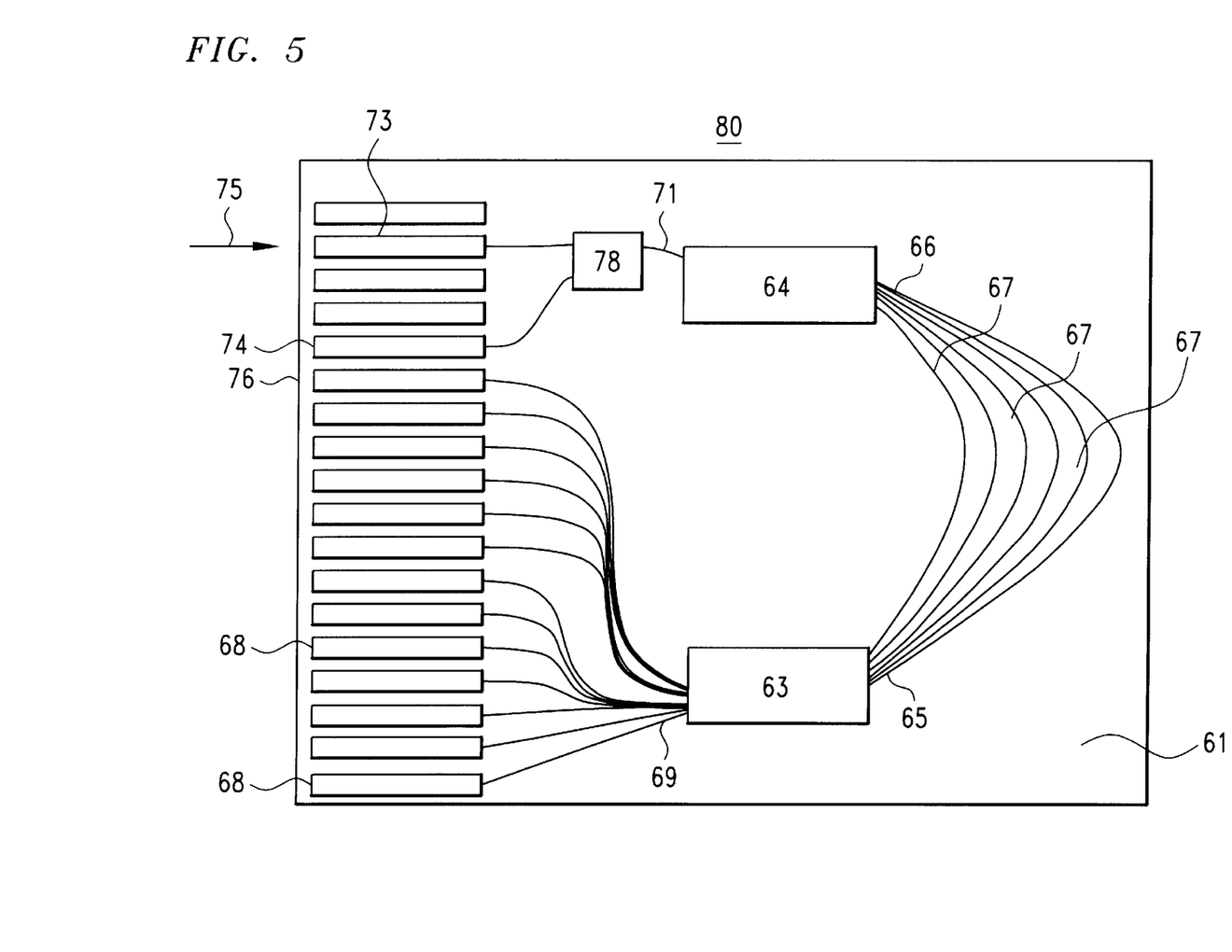

Another embodiment is the MFL 80 shown in FIG. 5. In this figure, elements that are the equivalent of elements of the MFL 60 shown in FIG. 4 are given the same reference numeral and will not be discussed unless necessary. In the MFL 80, the output power is derived entirely at the single exterior port 71 of the output coupling section 64 and this power is supplied to a power-divider 78, which for example may be a 3 db-coupler, and one part of the power is guided to the optical amplifier 74 and after amplification is all reflected back into coupling section 64. The other part of the divided power is supplied to the optical amplifier 73 and after amplification is partially reflected back to output coupling section 64 and partially transmitted into optical fiber 75.

It should be understood that the specific embodiment described is merely illustrative of the general principles of the invention. It has been mentioned above that various modifications are feasible without departing from the spit and scope of the invention. In particular, various other materials may be used and the semiconductive amplifiers and the WGR can be on separate substrates.

What is claimed:

1. A multifrequency laser apparatus that includes:

an optical waveguide grating router having input and output coupling sections, the input coupling section having a plurality of interior ports and a plurality of exterior ports, the output coupling section having a plurality of interior ports and at least one exterior port;

a plurality of pairs of semiconductive amplifiers, each pair tuned by its resonant structure to operate at a different frequency, the output of each amplifier being applied to a different exterior port of the input coupling section with different lengths of resonant structures associated with each amplifier of a pair;

each interior port of said input coupling section being connected to a different interior port of the output coupling section, and at least one exterior port of the output coupling section supplying a laser output of desired frequency.

2. A multifrequency laser apparatus in accordance with claim 1 in which at least one exterior port of the output coupling section supplies its output partially to a broadband optical semiconductive amplifier for amplification and partially back into the waveguide grating router.

3. A multifrequency laser apparatus in accordance with claim 1 in which the waveguide grating router and the semiconductive amplifiers are integrated on a common substrate.

4. A multifrequency laser in accordance with claim 2 in which the waveguide grating router and the semiconductive amplifiers are integrated on a common substrate.

5. A multifrequency laser apparatus in accordance with claim 1 in which the output frequency of the laser is determined by simultaneously activating selectively the two amplifiers of a pair of optical amplifiers.

6. A multifrequency laser apparatus in accordance with claim 1 in which reflecting surfaces are provided both outside the optical amplifiers and outside the exterior port of the output coupling section for forming separate resonant structures of different optical lengths for each semiconductive amplifier pair.

7. A multifrequency laser apparatus in accordance with claim 6 in which the waveguide grating router and the semiconductive amplifiers are integrated on a common semiconductor substrate.

8. A multifrequency laser in accordance with claim 7 in which a broadband semiconductive amplifier is connected between the exterior port of the output coupling sector and an optical fiber and the broadband amplifier is modulated off and on by signal information.

9. A multifrequency laser in accordance with claim 1 in which reflecting surfaces are provided outside the semiconductive amplifiers and outside the exterior port of the output coupling section for forming a wavepath for each semiconductive amplifier resonant at the frequency at which it is tuned.

10. A multifrequency laser in accordance with claim 9 in which signal modulation is applied simultaneously selectively on a pair of semiconductive amplifiers tuned to a desired frequency.

11. A multifrequency laser in accordance with claim 9 in which the waveguide grating router and the semiconductive amplifiers are integrated on a common substrate.

12. A multifrequency laser apparatus comprising:
   a semiconductive substrate;
   a waveguide grating router formed on said substrate, the router having input and output coupling sections, each with interior and exterior ports, and grating arms connected between the interior ports of the two coupling sections;
   N narrowband optical amplifiers, each designed to operate at a different frequency, each of whose outputs is supplied to a different one of the exterior ports of the input coupling section;
   reflective surfaces being provided for forming resonant structures that enclose the waveguide grating router and the N amplifiers; and
   means for supplying additional feedback light to the output coupling section of the waveguide grating router for stabilizing the frequency of the output of the apparatus at a chosen value.

13. The apparatus of claim 12 in which the output coupling section of the waveguide grating router includes a pair of exterior ports, each of which supplies a broadband optical amplifier, both of which provide said feedback and one of which also provides the light for utilization.

14. A multifrequency laser for providing light at a chosen one of N output frequencies comprising:
   an optical waveguide grating router having input and output coupling sections, the input coupling section having interior and N exterior ports, the waveguide grating being connected between the interior ports of the input and output coupling sections;
   N semiconductive amplifiers each designed to be operated at a different frequency and supplying a different exterior port of the input coupling section;
   a separate broadband amplifier connected to each of the two exterior ports of the output coupling section of which one is designed for providing output light of the desired frequency for utilization and the other for supplying a different exterior port of the input coupling section;
   a broadband semiconductive amplifier which is designed to amplify each of the N frequencies coupled to the exterior port of the output coupling section and whose output is light of the desired frequency;
   and a feedback path for returning a portion of said output light to the exterior port of the output coupling section.

15. A multifrequency laser in accordance with claim 14, in which the light fed back is supplied to said exterior port of the output coupling section.

16. A multifrequency laser in accordance with claim 14 in which the light fed back is amplified in a separate broadband semiconductive amplifier and then returned.

\* \* \* \* \*